US010446597B2

United States Patent
Sandri et al.

(10) Patent No.: US 10,446,597 B2
(45) Date of Patent: Oct. 15, 2019

(54) HERMETIC ELECTRONIC-COMPONENT PACKAGE, IN PARTICULAR FOR AN IMAGE SENSOR

(71) Applicant: Teledyne e2v Semiconductors SAS, Saint Egreve (FR)

(72) Inventors: Philippe Sandri, Herbeys (FR); Pierre Reber, Massieu (FR); Charlotte Alluis, Grenoble (FR); Laurent Riondet, Seyssins (FR)

(73) Assignee: TELEDYNE E2V SEMICONDUCTORS SAS, Saint Egreve (FR)

( * ) Notice: Subject to any disclaimer, the term of this patent is extended or adjusted under 35 U.S.C. 154(b) by 0 days.

(21) Appl. No.: 15/953,582

(22) Filed: Apr. 16, 2018

(65) Prior Publication Data

US 2018/0301489 A1 Oct. 18, 2018

(30) Foreign Application Priority Data

Apr. 18, 2017 (FR) ...................................... 17 53335

(51) Int. Cl.
*H01L 27/146* (2006.01)
*H01L 23/04* (2006.01)
*H01L 23/10* (2006.01)

(52) U.S. Cl.
CPC ........ *H01L 27/14618* (2013.01); *H01L 23/04* (2013.01); *H01L 23/10* (2013.01); *H01L 27/14698* (2013.01); *H01L 27/14636* (2013.01)

(58) Field of Classification Search
CPC .... H01L 23/04; H01L 23/10; H01L 27/14618
(Continued)

(56) References Cited

U.S. PATENT DOCUMENTS 7,580,075 B2 * 8/2009 Minamio .......... H01L 27/14618
348/340
2005/0151272 A1 * 7/2005 Street ................ H01L 27/14618
257/787
(Continued)

FOREIGN PATENT DOCUMENTS

| EP | 1523045 A2 | 4/2005 |
| EP | 1796168 A2 | 6/2007 |
| EP | 2164102 A1 | 3/2010 |

OTHER PUBLICATIONS

Search Report in French Application No. 1753335, dated Feb. 14, 2018.

*Primary Examiner* — Matthew E Warren
(74) *Attorney, Agent, or Firm* — Pilloff & Passino LLP; Sean A. Passino; Rachel K. Piloff (57) ABSTRACT

In a hermetic integrated-circuit package, the peripheral wall that bounds the cavity 2 containing the integrated circuit has, all the length of the peripheral wall, a surface containing a relief, which is defined by a raised planar zone z1, on the side inside the package of the cavity, and a recessed zone z2, on the exterior of the raised planar zone. The planar zone makes direct contact with the closing plate 6 of the package, without interposition of adhesive, over the entire length of the peripheral wall, except where planarity defects prevent the contact. The recessed zone does not make direct contact with the closing plate, and contains an adhesive bead that joins the closing plate and the upper portion of the peripheral wall over all the peripheral length of the latter. The adhesive bead 9 has a surface Se in open air between the closing plate and the recessed zone, on the exterior side of the package. This surface serves as an exchange surface with the exterior atmosphere of the package, in case of adhesive degassing.

14 Claims, 3 Drawing Sheets

(58) Field of Classification Search
USPC .................................................. 257/433, 434
See application file for complete search history.

(56) References Cited

U.S. PATENT DOCUMENTS

| | | | | |
|---|---|---|---|---|
| 2007/0159703 A1* | 7/2007 | Apel | ...................... | G02B 7/021 359/819 |
| 2008/0179696 A1* | 7/2008 | Chen | ..................... | B81B 3/0005 257/415 |
| 2008/0296719 A1* | 12/2008 | Ichikawa | ................... | G01J 5/04 257/434 |
| 2010/0025845 A1 | 2/2010 | Merz et al. | | |

* cited by examiner

Prior Art

Fig. 1

Prior Art

HERMETIC ELECTRONIC-COMPONENT PACKAGE, IN PARTICULAR FOR AN IMAGE SENSOR

CROSS-REFERENCE

This application claims priority benefit of French Patent Application no. 1753335, filed Apr. 18, 2017, which application is incorporated herein by reference in its entirety.

TECHNICAL FIELD

The invention relates to a hermetic electronic-component package, in particular for aerospace applications. The invention is in particular applicable to image sensors.

PRIOR ART

The encapsulation of an electronic component (component or bare chip) into a hermetic package provides mechanical and chemical protection from aggressions associated with its exterior operational environment. In certain cases, it is also a question of maintaining a relatively high vacuum (absence of gas or controlled nature and amount of gas) in the internal cavity of the package in order to allow the electronic component placed in this cavity to operate as it should.

Figure 1:
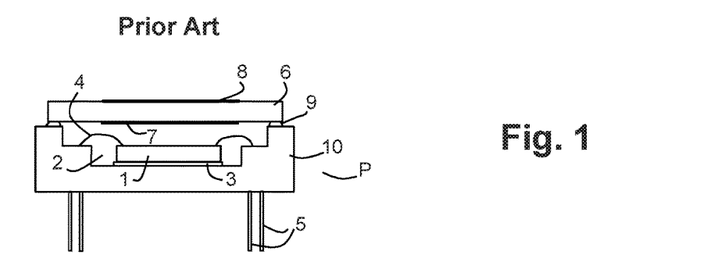
FIG. 1 illustrates a cross section of an electronic component in a hermetically closed package according to the prior art.
Figure 2:
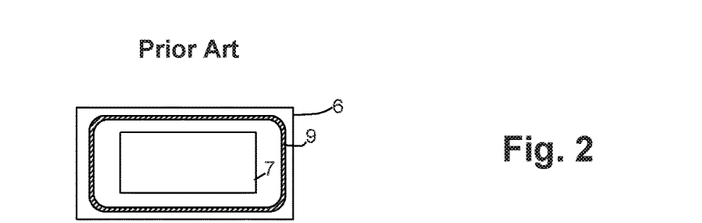
FIG. 2 shows the internal face of a package-closing plate comprising a transparent window, said plate being equipped with a bead of closing adhesive with a view to carrying out a sealing bonding operation on a package.

FIG. 1 for example illustrates the encapsulation of an integrated-circuit chip. The chip 1 is adhesively bonded to the bottom of a cavity 2 of a package, by means of a bonding adhesive 3; the connecting pads of the chip are electrically connected by any known technique, for example soldering of conductive wires 4, to connection lands provided in the interior of the package, and these lands are interconnected to pins 5 (in the example pins to be soldered) of the interfacing connector of the package. The cavity is then hermetically closed (sealed) with a closing plate 6. When it is a question of an image-sensor chip, the closing plate is or incorporates a window that is transparent to useful radiation (i.e. the radiation detected by the image sensor) and this window is located above the photosensitive area. More generally, the closing plate is or incorporates a transparent window when the component must emit or receive (detect) optical radiation. The transparent window is generally provided with an antireflection layer on its internal face and/or on its external face. These are the layers referenced 7 and 8 in FIG. 1, respectively. The hermetic seal is obtained with an adhesive bead 9 that is present all the length of the upper portion of the peripheral wall 10 of the package, and that joins the plate to the wall of the package over all its perimeter. This is achieved in the following way: a pre-polymerized closing adhesive bead 9 is deposited, for example by screen printing, on the internal face of the plate (FIG. 2). The plate equipped with its adhesive bead is placed on top of the wall of the package, and the adhesive bead is then engaged between the plate and the planar upper wall portion 10. The assembly is placed in a clamp and put into an oven in order to polymerize/cross-link the adhesive. After polymerization, the adhesive bead forms a seal-tight hermetic seal between the plate and the package. Its thickness is determined in order to allow deformation of the materials of the plate and package, the expansion coefficients of which are generally different, to be absorbed.

The manufacture of components intended for the aerospace industry must meet very strict standards, that have been drawn up to guarantee these components are highly reliable under their conditions of use. In particular, it is known that the various materials of the package/component/plate assembly, in particular the adhesives, resins or solders, may liberate gas molecules in steps inside a thermal enclosure. This has an impact on the atmosphere in the cavity; if the package is made of metal, this promotes corrosion. Various measures are therefore conventionally used to decrease/limit the amount of gas molecules in the cavity after it has been sealed (residual gas). In particular, the following conventional measures are applied:

the materials (adhesives, resins, etc.) chosen are qualified because of their compositions, i.e. the nature of their solvents/volatile compounds (TML "Total Mass Loss" and CVCM "Collected Volatile Condensable Material" qualification tests);

surfaces of the assembly are forcibly degassed before sealing, this forced degassing being carried out in an oven (for example baking at about 150° C. for about 100 hours) with a view to removing a maximum amount of volatile compounds before sealing;

the step of sealing the closing plate is carried out under a controlled atmosphere, for example under a bell jar, in an inert gas atmosphere (argon, nitrogen) or under vacuum.

Various tests are used to check that the components meet the specifications required by the standards. A thermal-resistance test is in particular provided in order to check and quantify the effects of cycles of rapid temperature variations on the components and, in particular, nonlimitingly: their lifetime, the hermeticity or seal-tightness of the package, the degassing of volatile compounds, the hardening of materials, mechanical deformations or cracks, etc., allowing the ability of the component to operate correctly in an aerospace environment to be determined. For this test, the components are placed in a thermal enclosure and the temperature inside the enclosure is made to vary in a cycle of relatively abrupt variations, a certain number of times. For example, in each cycle, the temperature is made to vary between −55° C. and +125° C. with a slope that may range from a few degrees to more than 15 degrees per minute.

When it is a question of qualifying a (new) component, the test requires very many variation cycles, for example 1000 temperature variation cycles. After qualification, it is still necessary to test components after they have left the manufacturing line: it is then a question of detecting any components that do not meet the specifications allowing the operational lifetime of the component to be guaranteed. To do this, reliability tests that are less rigourous versions of the qualification tests are used. In particular the thermal-resistance test is then limited to about 10 cycles.

TECHNICAL PROBLEM

In the case of packages closed with a closing plate containing a transparent window, one or more spots, which are generally whitish and disseminated over the internal face of the window of certain packages, have been observed to appear during the thermal-resistance test.

These spots bear witness to the presence of a certain amount of gas in the interior of the closed cavity of the package: they are gas condensates trapped on the internal face of the transparent window, and more precisely, on the antireflection layer coating this face (if this layer is actually present). In other words, the observed spots correspond to condensation of gaseous species, this condensation being promoted by the temperature cycles of the test.

These spots may be disseminated just about everywhere: on the edge of the window, this not being problematic; or closer to the centre, and here they have a very great impact on the transmission of useful radiation. It has been shown, by simulation, that the position of these spots corresponds to preferential paths toward colder sites of the plate. It has also been observed that the situation is subject to change: i.e. during the operational life of the component, other new spots may be added to the spots observed at the end of the thermal-resistance test.

Thus, when the spots appear following a thermal-resistance test, the component in question must be scrapped, irrespectively of the number, extent or position of the spots. This is a real problem in terms of the reliability and manufacturing cost of these components.

Following many trials, it has been shown that these gas condensates are not due to defects in the hermeticity of the components, but rather to species degassed by the surfaces inside the component during the sealing, and during temperature variations. In other words, the temperature cycles of the thermal-resistance test make further degassing of the materials of the assembly possible, inside the cavity.

Thus, the precautionary measures taken during the encapsulation in order to limit the amount of species degassed during the encapsulation and sealing prove to be insufficient to prevent the formation of white spots during subsequent thermal tests and/or during operational use, in particular depending on the thermal conditions.

It has also been shown, in particular by carrying out trials on assemblies made up of various combinations of materials, that the species degassed during these thermal cycles mainly come from the closing adhesive. A structural explanation for this has been found: there is in fact a large exchange surface between the closing adhesive and the atmosphere of the cavity, because of the height of the adhesive bead and the length of the peripheral wall. In comparison, the exchange surface between the bonding adhesive under the chip and the cavity is much smaller: the thickness of the bonding adhesive is much smaller (it serves merely to bond, and possibly to produce an electrical contact, and not to produce a seal-tight hermetic seal that is able to absorb mechanical deformation); and the perimeter of the chip is also less long, compared to the length of the wall.

It is not possible to decrease the thickness of the closing adhesive: after polymerization the adhesive seal must have a certain thickness, in order to be able to play its role in absorbing deformation of the materials of the package and plate (different expansion coefficients) under operational conditions (temperature). It is also not possible to further decrease the size of the cavity as it has, depending on the component, already been optimized to be as small as possible in order to decrease the bulk of the package. Lastly, only a few different closing adhesive compositions are able to pass the TML and CVCM qualification tests required by the aerospace industry; at the end of these tests, none of these adhesive compositions has proved to be significantly better than the others from this point of view. In other words, spots appear in every case.

It is therefore necessary to find other ways of further decreasing the amount of degassed species confined inside the package with the aim in particular of preventing the formation of spots on the transparent window of the plate.

It is known to use getters that are capable of trapping, on their surface, all or some of the gases present inside a cavity. The term getter (sorbeur in French) is the term used in the technical literature. These getters are well known. Zirconium, titanium, niobium and vanadium are metals that are commonly used as getters, whether alone or in alloys. It is a question of producing a getter that is reactive to the gaseous species present. Patent applications US 2010/0025845 or EP2004542 discuss the use of such getters, more specifically in the context of microelectromechanical-system (MEMS) chips. In particular, to be effective these getters must have a large exchange surface. If the getter is placed at the bottom of the package, in proximity to the chip, the dimensions of the cavity are notably increased. To solve the underlying large-exchange-surface/low-bulk problem, the getter could be formed on the internal surface of the closing plate. This solution is generally not suitable when the chip must detect or emit radiation through the closing plate. Furthermore, as explained in the aforementioned patent applications, the use of getters leads to other considerations/constraints: additional steps of forming the getter (layered structure) and appropriateness with respect to the encapsulation/sealing temperatures, activation temperature of the getter effect, progressive saturation of the surface of the getters, etc.

SUMMARY OF THE INVENTION

The invention proposes to solve the technical problem of degassing of gaseous species in the interior of the package during and after the sealing operation.

According to the prior art, as explained with reference to FIGS. 1 and 2, the package is sealed with a closing plate and an adhesive bead between the closing plate and the planar upper surface of the peripheral wall, which forms a seal over the entire peripheral length of the wall.

The idea on which the invention is based consists of modifying the relief of the upper surface of the wall so that, structurally, the adhesive bead is isolated on the interior side from the cavity and, on the exterior side of the package, has a surface in open air, so as to force the degassing of the adhesive toward the exterior of the package via this surface. Structuring the upper surface of the wall according to the invention is effective both during the sealing and after sealing. It is easy and inexpensive to implement and leads to no particular constraints. Furthermore, and this is an advantage, it has no influence on the dimensions of the package, i.e. it may be implemented without needing to change the dimensions of the package.

The invention therefore relates to a hermetic integrated-circuit package including a bottom and a peripheral wall rising from the bottom that defines an interior cavity of the package and contains an integrated circuit and a closing plate that is adhesively bonded to the upper portion of the peripheral wall. The upper portion of the peripheral wall is a relief-containing surface comprising, on the one hand, a first planar zone that makes direct contact with the closing plate, without interposition of adhesive, over the entire length of the peripheral wall on the interior side of the cavity, except where planarity defects prevent the contact, and on the other hand, on the exterior of this first planar zone, a recessed zone that does not make direct contact with the closing plate. An adhesive bead is present in the recessed zone and joins the closing plate and the upper portion of the peripheral wall over the entire peripheral length of the latter. The adhesive bead has a surface in open air between said closing plate and said recessed zone, on the exterior side of the package.

Ideally, the first planar zone makes direct contact, without interposition of adhesive, with the closing plate over the entire length of the peripheral wall. However, because of the length of the peripheral wall, defects in the planarity of the surfaces of the plate and wall may prevent direct contact, in certain locations, between the first planar zone and the closing plate, and in these locations, the adhesive seal then has a surface, on the interior side of the package, that is exposed to the atmosphere in the interior of the cavity. However, the total area of seal exposed on the interior side of the package because of planarity defects is much smaller than the area of adhesive seal exposed to open air on the exterior side of the package: the adhesive mainly degasses to the exterior of the package. Thus, the structuring of the upper surface of the peripheral wall of the package that is proposed in the invention has the technical effect, if the closing adhesive does indeed degas, and whether this be during the sealing operation, during thermal tests, or even under operational constraints, of forcing the closing adhesive to degas mainly to the exterior of the package.

According to one aspect of the invention, the recessed zone comprises a second planar zone that is lower than the first planar zone.

According to another aspect of the invention, a third planar zone that is higher than the second planar zone is provided the length of the wall on the exterior side of the package.

According to another aspect of the invention, the recessed zone extends as far as to the exterior wall edge and includes a protuberance in relief at a distance from the exterior package edge.

The flank between a higher zone (first or third zone) and the bottom of the recessed zone may have a profile defining a width of the higher zone that increases with distance from the upper surface that makes direct contact with the closing plate to the level of the recessed zone.

Advantageously, the relief-containing upper portion of the peripheral wall is a frame, made of metal or made of ceramic.

The invention implemented to encapsulate image sensors allows the problem of appearance of spots on the closing plate window to be solved. However, it will be understood that it applies more generally to the encapsulation of electronic components in hermetic packages, since it prevents the closing adhesive from degassing into the interior of the cavity.

BRIEF DESCRIPTION OF THE DRAWINGS

Other features and advantages of the invention will become apparent on reading the following detailed description that is given with reference to the appended drawings, in which.

DETAILED DESCRIPTION

The invention relates to a package for encapsulating an electronic component. The package comprises a peripheral wall that rises from a bottom of the package and bounds a cavity. The package is closed by a closing plate that is added and adhesively bonded to the upper portion of the peripheral wall. An adhesive bead joins the closing plate to the peripheral wall over the entire length of the wall.

According to the invention, the upper surface of the peripheral wall has a relief such that the adhesive bead is isolated interior side from the cavity, and on the exterior side of the package, has an exchange surface with the exterior atmosphere of the package.

More precisely, the relief is defined by a raised planar zone that runs all the length of the peripheral wall, on the side inside the package of the cavity, and a recessed zone on the exterior of the raised planar zone. The planar zone is intended to make direct contact with the closing plate of the package over the entirety of the length of the peripheral wall, without interposition of adhesive therebetween, but surface-planarity defects over this length may make it so that they are slightly spaced apart in certain places. The recessed zone does not make direct contact with the closing plate, and contains an adhesive bead that joins the closing plate and the upper portion of the peripheral wall over the entire peripheral length of the latter. The adhesive bead has a surface in free air between the closing plate and the recessed zone, on the exterior side of the package. In case of degassing of the closing adhesive, the gaseous species exit via this surface toward the exterior of the package.

A plurality of embodiments may be envisaged, which embodiments will be described with reference to FIGS. 3 to 8. It will be noted that the figures have not been drawn to scale, in order to better illustrate aspects of the invention; in particular, the relief in the upper wall surface has not been drawn to scale, the height of the relief, which in practice corresponds to the height (thickness) of the adhesive bead at the end of the sealing operation, being of the order of about ten microns. It will also be noted that for the sake of simplicity, elements that are the same have been given the same references in all of FIGS. 1 to 8. In particular, in all the figures, the closing plate 6 illustrated is a plate with a window that is transparent to useful radiation (for the electronic component, which is an emitter or receiver). In other words, the plate may be a glass plate, i.e. a glazing, that is entirely transparent, as illustrated in the figures; or indeed the plate may incorporate a transparent window in a frame, which frame may then be made of the same material as the package. In the figures, an antireflection layer is present on each of the faces (layers 7 and 8 in the figures), but this is not absolutely necessary. The package comprises a cavity 2 that is bounded by a peripheral wall 10 that rises from a bottom of the package P. An integrated circuit 1 (a bare chip in the illustrated example) is adhesively bonded to the bottom of this cavity and electrically connected to the pins of the electrical connector of the package, in the example via soldered wires 4 and interconnecting lands that are connected to the pins of the connector. The package is hermetically closed using an adhesive bead 9 that joins the plate and the package over the entire length of the peripheral wall of the package. These various connecting and encapsulating aspects are well known and amount to connecting and encapsulating techniques that are well known to those skilled in the art.

The invention will now be described in detail.

Figure 3:
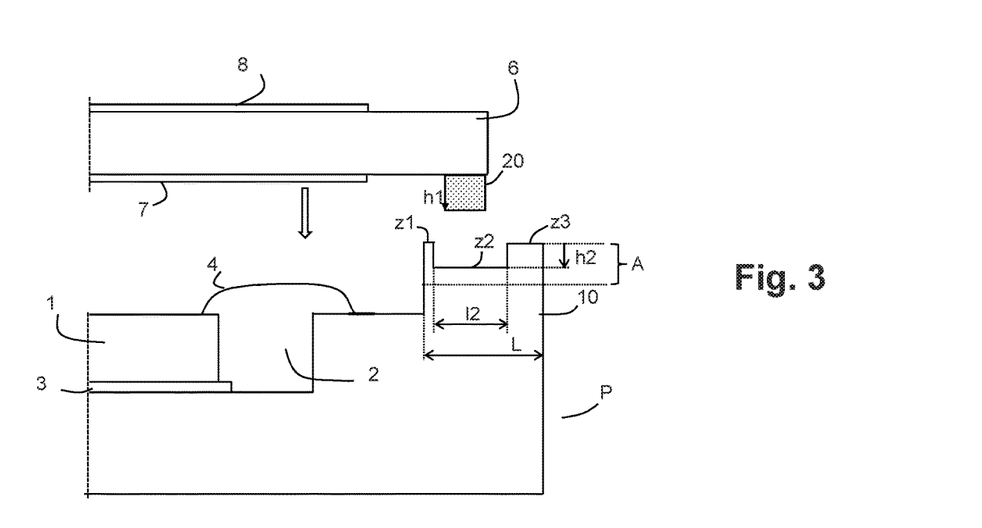
FIGS. 3 and 4 shows the same partial cross-sectional view of a package, the cross section being cut in the direction of the thickness of the peripheral wall of the package, and detail one type of relief in the upper wall of the package wall according to the invention, before (FIG. 3) and after (FIG. 4) sealing with the closing plate.
Figure 4:
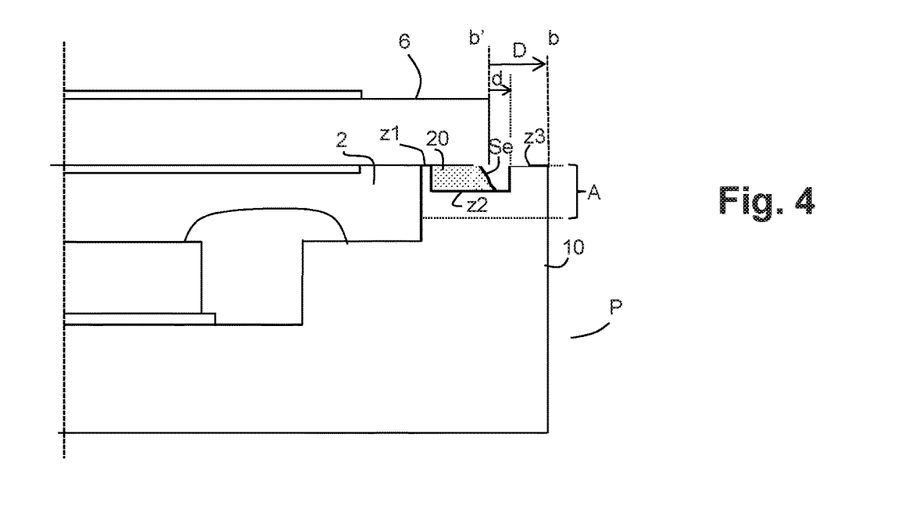
Figure 5:
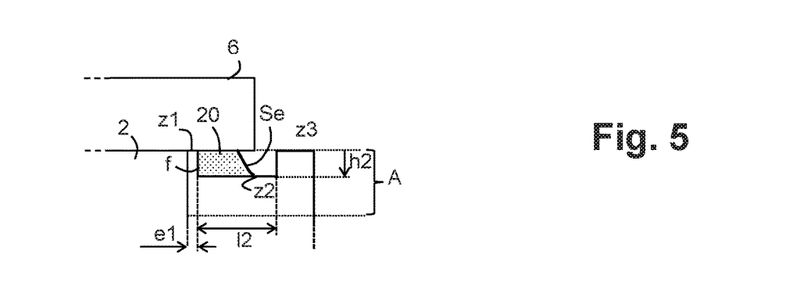
FIGS. 5 to 8 illustrate various upper-wall-portion relief profiles of a package sealed according to the invention.
Figure 6:
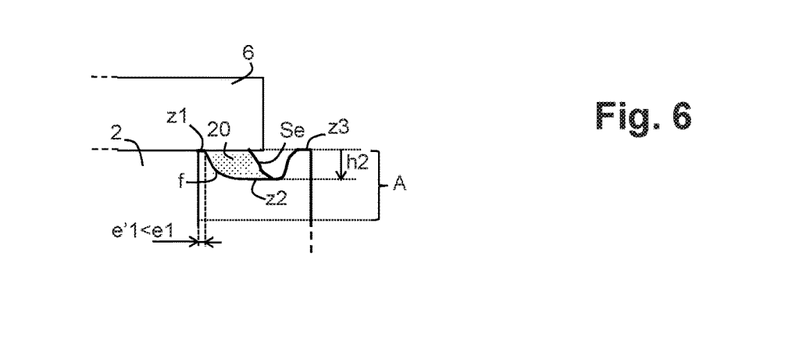

A first embodiment of the invention is shown in FIGS. 3 to 5. In this embodiment, the area of the closing plate is smaller than the area of the package as defined by the external edge of the peripheral wall. In other words, as may be seen in FIG. 4, the external edge (b) of the peripheral wall 10 is at a distance D from the edge (b') of the closing plate 6.

FIG. 3 shows the package P and the closing plate 6 before sealing. The closing plate 6 is equipped with a closing adhesive bead 9 of given thickness h1. The adhesive was deposited, in paste form, by screen printing or syringe. It is a thermoset, generally a resin, and may be mono or bicomponent.

According to the invention, the upper surface of the peripheral wall 10 of the package is not uniformly planar. It is a surface structured with a relief that forms a groove that is produced over the entire length of the peripheral wall (i.e. it encircles the cavity). Thus, in the width L of the peripheral wall, there is a substantially planar zone z2 of width l2 (the groove) flanked by two raised planar zones on each side: a raised zone z1 on the interior side of the package and a raised zone z3 on the exterior side of the package.

FIG. 4 shows the package hermetically closed by the plate, after sealing (baking clamped in an oven, in order to polymerize the closing adhesive) and FIG. 5 shows, in greater detail, the joint between the plate and the upper portion A of the wall of the package: the raised planar zone z1 makes direct contact, without interposition of adhesive, with the closing plate 6; however, it will be understood that the two portions (zone z1 and plate 6) may be spaced apart in certain locations because of defects in the planarity of the surfaces over the length of the peripheral wall; the adhesive bead is contained between the flank f joining the raised planar zone z1 to the bottom (zone z2) of the groove, the internal face of the closing plate 6 and the bottom of the groove (z2). The closing plate is spaced apart from the bottom of the groove by the thickness of adhesive; and it does not cover all the width l2 of the groove: as shown in the figure, the interior edge b" of the raised planar zone z3 is at a distance d (d<D) from the edge b' of the plate. Thus, because of the relief, the adhesive bead has a surface in free air on the exterior side of the package that serves as an exchange surface Se with the exterior atmosphere of the package.

The zone z3 may serve as a bearing surface during subsequent integration of the component into an equipment system. This zone z3 may be at the same level as the zone z1 as illustrated; but it could also be higher or slightly lower, depending on the stated requirements of the OEM.

On the interior side of the package, the zone z1 forms, with the closing plate, an insulating mechanical barrier between the interior of the cavity (2) and the adhesive bead 9. The zone z1 is preferably as narrow as possible in order to achieve an optimal area of adhesion of the adhesive to the plate 6. The limits depend on the mechanical strength properties of the material of the package. For example, for a ceramic package, the width e1 of the zone z1 will possibly be about one millimeter.

It is advantageously possible to optimize the area of adhesion of the adhesive to the plate by giving the flank of the zone z1 a profile groove-side so as to gradually increase this width from the upper surface of the zone z1 making direct contact with the plate to the bottom of the groove z2. The profile may for example be S-shaped (sigmoid-shaped) or bevel-shaped. In the example of a ceramic package, the width e'1 of the zone z1 level with the closing plate may for example be 100 microns, and may reach a few millimeters level with the zone z2 (bottom of the groove).

Giving the flank of the zone z1 a profile also advantageously allows the dimensions of the wall and more specifically its width L to be tailored to a given component. It has been seen that it is sought to apply the invention without changing the dimensions of the package. Depending on the component and the application, the peripheral wall may be more or less wide. However, the dimensions of the zone z2 are constrained by the dimensions of the adhesive bead after sealing (bake under pressure), with a view to achieving the desired seal-tightness and adhesion effect between the plate and the package. The variables that may be adjusted to form the zone z2 of adhesion are thus the widths and/or profiles of the zones z1 and/or z3. In particular, the zone z3 may be profiled with a steep or indeed bevelled flank, as may the zone z1.

The thickness h1 of adhesive (before heating under pressure) and the dimensions of the groove h2, l2 are defined depending on the properties of the adhesive in order to ensure the quality of the adhesion and seal-tightness between the closing plate and the wall of the package. For example, the height h1 of adhesive on the plate, before sealing, is 50 or 80 microns (FIG. 3); the groove z2 has a depth h2 of about 10 to 60 microns and a width l2 of about 1 mm or less, 500 microns for example.

In the sealing step, the closing adhesive bead of the plate is pressed against the bottom of the groove and spreads, filling the space defined by the bottom of the groove z2, the flank f of the zone z1 and the closing plate, without overflowing onto the planar surface of zone z1, which is pressed into direct contact against (or almost against) the closing plate. At the end of this operation, the area of adhesion between the plate and the wall of the package comprises the flank f, and one portion at least of the width of the groove (this could be the entire width l2 of the groove), and this ensures the plate is solidly and hermetically anchored to the package. A person skilled in the art will be able to determine, depending on the properties of the closing adhesive, the height and width of the bead to pre-deposit on the plate, and to determine, depending on the position and dimensions of the groove in the wall of the package, the position in which the bead must be on the plate to obtain the desired adhesion and seal-tightness qualities after the heating and clamping operation that is carried out subsequently. In the heating and clamping operation, the adhesive is squeezed and spreads in the space bounded by the plate, the groove zone z2 and the flank f connecting this zone z2 to the zone z1, and the closing plate bears against the surface of the zone z1, over the entire peripheral length of the wall, mainly in direct contact, without interposition of adhesive. In the portions where direct contact is not possible because of surface planarity defects, the two portions remain close, with a spacing that generally does not exceed 10 to 20 microns.

Figure 7:
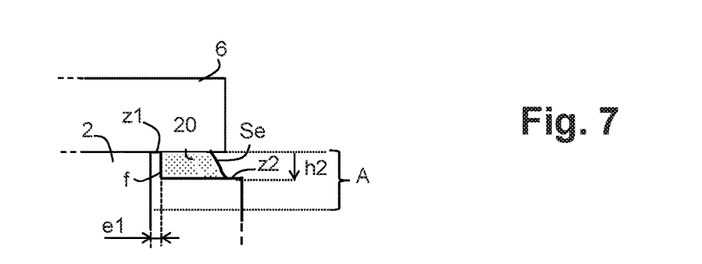
Figure 8:
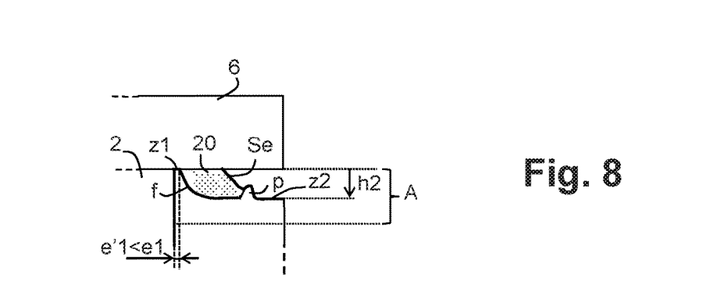

FIGS. 7 and 8 show two variant embodiments that may be used when provision is not made for the package to have, on the exterior edge of the wall, a bearing surface with a view to integration into an external piece of equipment. In this case, it is not necessary to provide the raised external zone z3 of FIGS. 3 to 6. The zone z2 then no longer defines a groove, but more generally a zone z2 that is recessed with respect to the raised zone z1 and that extends as far as to the exterior wall edge. The adhesive may then spread over the width of the recessed zone z2. Optionally, as illustrated in FIG. 8, provision may be made for a small protuberance 22 in relief in the recessed zone z2, in order to prevent the adhesive spreading as far as to the edge or beyond the edge of the wall. In these two examples of a relief, i.e. with and without a protuberance, the flank f joining the zone z1 to the recessed zone z2 may be quite abrupt (steep flank in FIGS. 5 and 7) or profiled with a bevel- or S-shape (FIGS. 6 and 8), the latter variant allowing, as was mentioned above, the width of the surface of the zone z1 making contact with the plate to be optimally decreased without weakening this zone. The flank of zone z3 may also be steep (FIG. 5) or profiled with a bevel- or S-shape.

The relief in the upper surface of the wall may easily be produced by machining, etching or other techniques suitable for forming the groove/recessed zone z2, and the desired profiles of the one or more raised zones, depending on the material of the package (ceramic or metal, generally).

In one variant, the upper portion A of the wall, which portion is bounded by the dotted lines in the FIGS. 5 to 8, may be produced in the form of a frame, for example a ceramic frame or even a metal frame, for example a metal frame made of Kovar (Ni—Fe—Co alloy). The frame is then added and adhesively bonded to the planar upper wall surface of the package (with a very thin layer of adhesive of the type used in chip bonding, or by soldering). The volatile species of the frame and of the adhesive or solder may be mainly or entirely removed via the forced degassing operation, prior to the sealing, as was described above. In practice, the height of the frame is dependent on the height h2 of the relief, and on the limits imposed by the form-moulding techniques of the art. For example, the frame has a height of a few hundred microns to a few millimeters and for example between 300 microns and 3 millimeters. With such a frame produced separately then added, the need to perform grinding operations on the surface of the wall of the package is avoided.

Other variant embodiments may be envisaged. For example the zone z3 may not be continuous over the entire length of the peripheral wall, but may be divided into segments forming as many bearing pads. The profile of the upper portion in cross section is then either that of FIG. 7 or 8, or that of FIGS. 5 and 6. Furthermore, when there are two raised zones z1 and z3, the profile of the flank of one may be different from the other, depending on the constraints and the respective dimensions. Production in the form of a separate frame in particular allows various profile variants to be produced, allowing a standard component package to be tailored to the specifications of different OEMs.

The invention that was described above with reference to the figures allows the reliability of components encapsulated in a hermetic package to be improved by forcing the degassing of the closing adhesive during and after sealing toward the exterior of the package, via the exchange surface Se on the exterior side of the package. In particular, in the context of components that are detectors or emitters of radiation, image sensors in particular, the formation of spots on the transparent window of the plate is effectively prevented. Thus, the reliability of these components for uses in the aerospace field is improved. The invention may be applied more broadly. It is not limited to the encapsulation of one particular type of electronic component, or to a package having a transparent window. It has been explained that residual gases in the interior of electronic-component packages are problematic for many reasons. The technical solution provided by the invention, which is simple and inexpensive to implement, may therefore apply, generally, to any type of hermetic electronic-component package, provided that it is useful or necessary to prevent any degradation of surfaces, including degradation of the internal surface of the closing plate (degradation of its transparency) and/or to control the atmosphere (pressure) in the interior of the cavity.

In the context of aerospace applications, the package is generally a ceramic package, but it may also be made of metal. In both cases, the relief will possibly be obtained by surface machining (etching) using any suitable means, or by adding a frame as indicated. However, the principle of the invention is also applicable to plastic packages. The relief shape will then generally be obtained by moulding.

The closing plate, when it is not entirely transparent (window in a frame), may be, as regards the non-transparent portion, made from the same material as the package.

The invention claimed is:

1. An hermetic integrated-circuit package including a bottom and a peripheral wall rising from the bottom and defining an interior cavity of the package, an integrated circuit in the cavity, and a closing plate having a planar lower face and a planar upper face, the planar lower face being adhesively bonded to the upper portion of the peripheral wall, closing the cavity, wherein:
   an upper surface of the peripheral wall contains a relief comprising, on the one hand, a first planar zone that makes direct contact with the closing plate, without interposition of adhesive, over the entire length of the peripheral wall on an interior side of the cavity, except where planarity defects prevent contact, and on the other hand, on the exterior of this first planar zone, a recessed zone that does not make direct contact with the closing plate;
   an adhesive bead is present in the recessed zone and joins the closing plate and the upper portion of the peripheral wall over the entire peripheral length of the latter; and
   the adhesive bead has a surface in open air between the closing plate and the recessed zone, on the exterior side of the package.

2. The hermetic package of claim 1, wherein the recessed zone comprises a second planar zone that is lower than the first planar zone.

3. The hermetic integrated-circuit package of claim 2, wherein the relief in the upper surface of the peripheral wall comprises a third planar zone the length of the wall on the exterior side of the package, and the second planar zone is lower than the third planar zone.

4. The hermetic package of claim 2, wherein the recessed zone extends as far as to the exterior wall edge and includes a protuberance in relief at a distance from the exterior package edge.

5. The hermetic package of claim 3, wherein the flank between the recessed zone, and the first planar zone and/or between the recessed zone and the third planar zone, has a profile defining a zone width that increases with distance from the upper surface of the highest planar zone to the level of the recessed zone.

6. The hermetic package according to claim 1, made of ceramic or made of metal.

7. The hermetic package according to claim 1, wherein the upper wall portion having the relief-containing surface is a frame.

8. The hermetic package of claim 1, for an image sensor wherein the closing plate is or comprises a window that is transparent to useful radiation.

9. The hermetic package of claim 1, for an image sensor, wherein the closing plate is a glass plate.

10. An hermetic integrated-circuit package including a bottom and a peripheral wall rising from the bottom and defining an interior cavity of the package, an integrated circuit in the cavity, and a closing plate, which is adhesively bonded to the upper portion of the peripheral wall, closing the cavity, wherein:
   an upper surface of the peripheral wall contains a relief comprising, on the one hand, a first planar zone that makes direct contact with the closing plate, without interposition of adhesive, over the entire length of the peripheral wall on an interior side of the cavity, except where planarity defects prevent contact, and on the other hand, on the exterior of this first planar zone, a recessed zone that does not make direct contact with the closing plate;

an adhesive bead is present in the recessed zone and joins the closing plate and the upper portion of the peripheral wall over the entire peripheral length of the latter;

the adhesive bead has a surface in open air between the closing plate and the recessed zone, on the exterior side of the package; and a flank joining the first planar zone and the recessed zone has a profile defining a first-zone width that increases with distance from the upper surface that makes direct contact with the closing plate to the level of the recessed zone.

11. The hermetic package according to claim 10, made of ceramic or made of metal.

12. The hermetic package according to claim 10, wherein the upper wall portion having the relief-containing surface is a frame.

13. The hermetic package of claim 10, for an image sensor, wherein the closing plate is or comprises a window that is transparent to useful radiation.

14. The hermetic package of claim 10, for an image sensor, wherein the closing plate is a glass plate.

* * * * *